United States Patent [19]
Cho

[11] Patent Number: 5,771,201
[45] Date of Patent: Jun. 23, 1998

US005771201A

[54] SYNCHRONOUS SEMICONDUCTOR DEVICE HAVING AN APPARATUS FOR PRODUCING STROBE CLOCK SIGNALS

[75] Inventor: Yong Deok Cho, Kyoungkido, Rep. of Korea

[73] Assignee: Hyundai Electronics Industries Co., Ltd., Rep. of Korea

[21] Appl. No.: 882,864

[22] Filed: Jun. 26, 1997

[30]     Foreign Application Priority Data

Jun. 29, 1997 [KR]    Rep. of Korea ................... 1996-26535

[51] Int. Cl.[6] ....................................................... G11C 8/00
[52] U.S. Cl. ........................................ 365/233; 365/233.5
[58] Field of Search ................................ 365/233, 233.5, 365/193, 194; 327/113, 117, 118, 119; 326/93, 95, 96

[56]              References Cited

U.S. PATENT DOCUMENTS 5,627,794  5/1997  Lee ........................................... 365/233
5,694,371  12/1997  Kawaguchi .............................. 365/233

Primary Examiner—David C. Nelms
Assistant Examiner—Son Mai
Attorney, Agent, or Firm—Blakely Sokoloff Taylor & Zafman

[57]              ABSTRACT

A synchronous semiconductor device which can distribute a clock signal inputted through an input pad from a top portion, not from a center portion, to bottom, left, and right portions of a chip. The synchronous semiconductor device comprises a frequency dividing section for dividing of an input clock signal, buffer section for distributing a divided clock signal outputted from the frequency dividing section to necessary parts of a chip, and frequency multiplying section, receiving the divided clock signal outputted from the frequency dividing section and the buffer section, for adjusting a pulse width thereof with a frequency identical to that of the input clock signal. The frequency of the clock signal is divided by the frequency dividing section, and the divided clock signal is distributed from a top portion of the chip to left, right, and bottom portions of the chip. Then the divided and distributed clock signal is multiplied by the frequency multiplying section to use the multiplied clock signal as a strobe input signal for registers provided in the device.

10 Claims, 6 Drawing Sheets

SYNCHRONOUS SEMICONDUCTOR DEVICE HAVING AN APPARATUS FOR PRODUCING STROBE CLOCK SIGNALS

BACKGROUND OF THE INVENTION

1. Field of the Invention

The present invention relates to an apparatus for producing a strobe clock signal used in an synchronous static random access memory (SRAM), and more particularly to an apparatus for producing a strobe clock signal used in an address register, data input/output register, control register.

2. Description of the Prior Art

Generally, a conventional clock generator for use in a synchronous SRAM operates to produce an internal clock signal using a lot of logical delay elements and distribute the internal clock signal to internal portions of a chip without frequency variation with respect to an input clock signal. In this case, since the delay times of the respective delay elements are not constant with one another, the internal clock signal should be distributed in such a manner that the lengths of the clock paths, which are taken along the distribution lines from an input clock pad to top, bottom, left, and right portions of the chip through a center portion of the chip, respectively, are similar to one another.

In the conventional clock generator, however, it is difficult to distribute the clock signal from the chip center since the layout density of a core portion of the chip is increased due to the increase of the number of input/output devices of the chip and the complexity of control signals. Further, if the clock signal is adjusted one by one with respect to a CPU clock signal K, adjustment of set up and holding time may be easily achieved. However due to the difference between skews of the clock signal, a margin is decreased by a narrow pulse width in a high speed operation.

SUMMARY OF THE INVENTION

It is an object of the present invention to solve the problems involved in the prior art, and to provide an apparatus for producing a strobe clock signal which can reduce current consumption in a large-sized driver and achieve a high speed performance with an easy adjustment of set up and holding time by appropriately adjusting the pulse width.

It is another object of the present invention to provide a synchronous semiconductor device wherein the layout density of a core part of a chip is not limited by distributing a clock signal through an input pad from top portion, not from a center portion, to bottom, left, and right portions of the chip.

In another aspect of the present invention, there is provided a synchronous semiconductor device comprising a first means for dividing a frequency of an input clock signal, a second means for buffering and distributing a divided clock signal outputted from the first means to necessary parts of a chip, and frequency multiply means, receiving the divided clock signal outputted from the first means and the buffer means, for adjusting a pulse width thereof with a frequency identical to that of the input clock signal, wherein the frequency of the clock signal is divided by the first means, the divided clock signal is distributed from a top portion of the chip to left, right, and bottom portions of the chip, then the divided and distributed clock signal is multiplied by the frequency multiply means to use the multiplied clock signal as a strobe input signal for registers provided in the device.

BRIEF DESCRIPTION OF THE DRAWINGS

The above objects, other features and advantages of the present invention will become more apparent by describing the preferred embodiments thereof with reference to the accompanying drawings, in which.

DETAILED DESCRIPTION OF THE PREFERRED EMBODIMENT

The strobe clock signal producing apparatus according to the present invention includes a frequency dividing section for dividing by ½ a frequency of an input clock signal K from a pad of a chip, buffer section for distributing a divided clock signal outputted from the frequency dividing section to necessary parts of the chip, a frequency multiplying section, receiving the divided clock signal outputted from the frequency dividing section and the buffer section, for adjusting a pulse width thereof with a frequency identical to that of the input clock signal K.

Figure 1A:
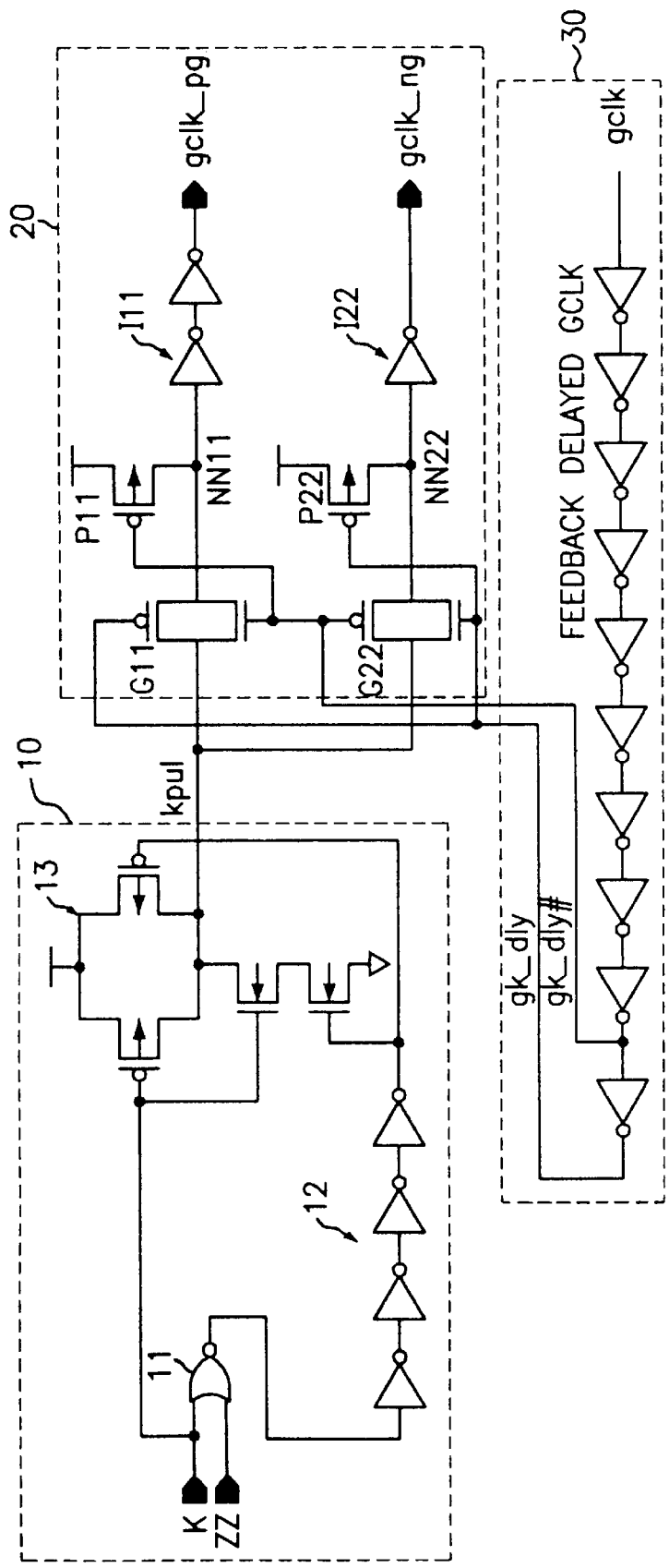
FIGS. 1A and 1B are circuit diagrams illustrating a frequency dividing section and a buffer section, respectively, according to an embodiment of the present invention.
Figure 3A:
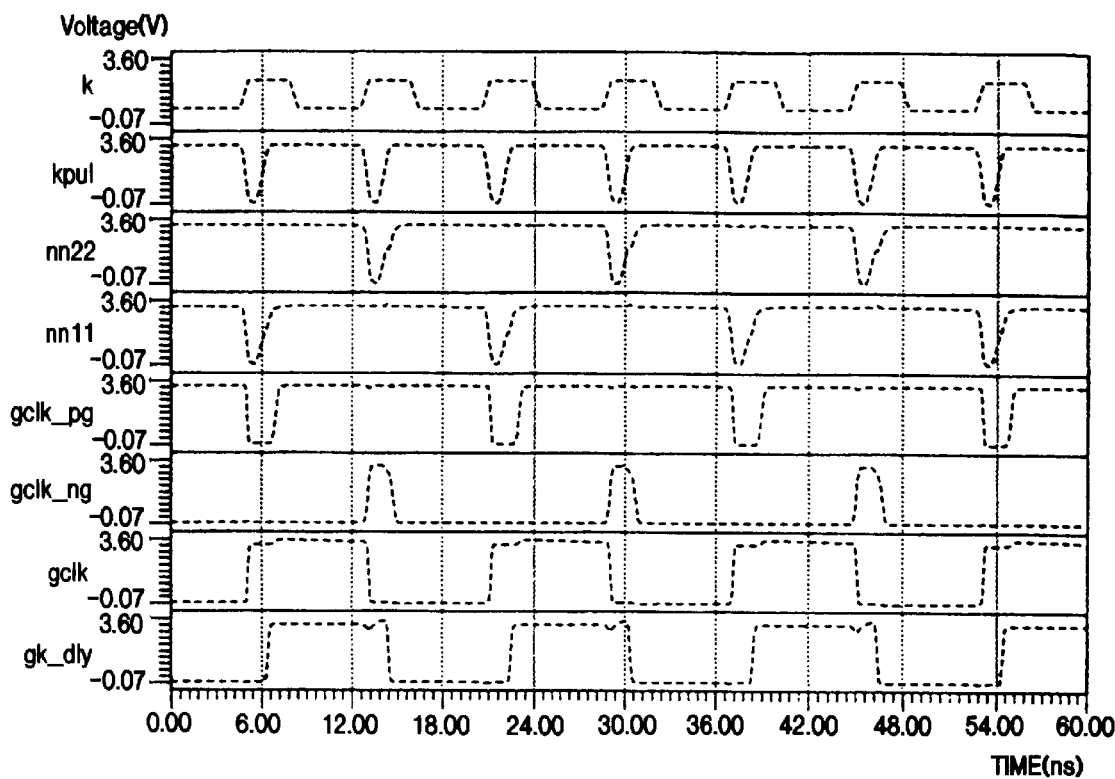
FIG. 3A is a timing diagram of the signals appearing at respective nodes of FIGS. 1A and 1B.

Referring to FIGS. 1A and 3A, the frequency dividing section (shown in FIG. 1A) includes a clock transition detection section 10, being enabled by an enable signal Z inputted from a chip pad, for detecting a transition of a CPU clock signal K inputted from the chip pad to output a clock transition detection pulse signal kpul, a selective output section 20 for selecting and outputting respective even and odd pulses of the clock transition detection pulse signal kpul outputted from the clock transition detection section 10, and a control section 30 for controlling the selective output section 20 by delaying the divided clock signal gclk.

The clock transition detection section 10 includes an NOR gate 11 for NOR-gating the enable signal outputted from the pad and the CPU clock signal K by producing a "low" level pulse gclk at a rising edge of the CPU clock signal K, a delay circuit 12 for delaying an output of the NOR gate 11, and a NAND gate 13 for NAND-gating an output signal of the NOR gate 11 and an output signal of the delay circuit 12.

The selective output section 20 includes a first path section for passing therethrough only the odd pulse gclk-pg of the clock transition detection pulse signal kpul detected the odd rising edge of the clock signal K by selecting and outputting respective even and odd pulses of the clock transition detection pulse signal kpul outputted from the clock transition detection section 10, a second path section for passing therethrough only the even pulse gclk-n of the clock transition detection pulse signal kpul detected at the even rising edge of the clock signal K.

Each of the first and second path section includes path gates G and G, pull-up devices P and P and buffer devices A and A which are connected to output terminals of the path gates G and G.

The control section 30 controls the pass gates G and G and pull-up devices P and P of the selective output section 20 by positive output gk-dly and negative output gk-dly# delayed the divided clock signal gclk (this will be more detail explained in the description of the buffer section).

Figure 1B:
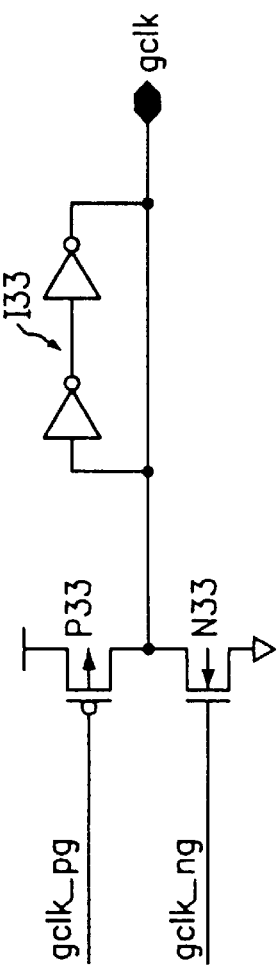

Next, referring to FIG. 1B, the buffer section (shown in FIG. 1B) includes a pull-up device P33 for pulling up its output terminal in response to a clock signal gclk-pg produced by detecting at the odd rising edge of the clock signal K from the frequency dividing section showing in FIG. 1A by finally producing the divided clock signal gclk, a pull-down device N33 for pulling down the output terminal in response to a clock signal gclk-ng produced by detecting at the even rising edge of the clock signal K from the frequency dividing section, and a latch device A for latching the output terminal.

Figure 2:
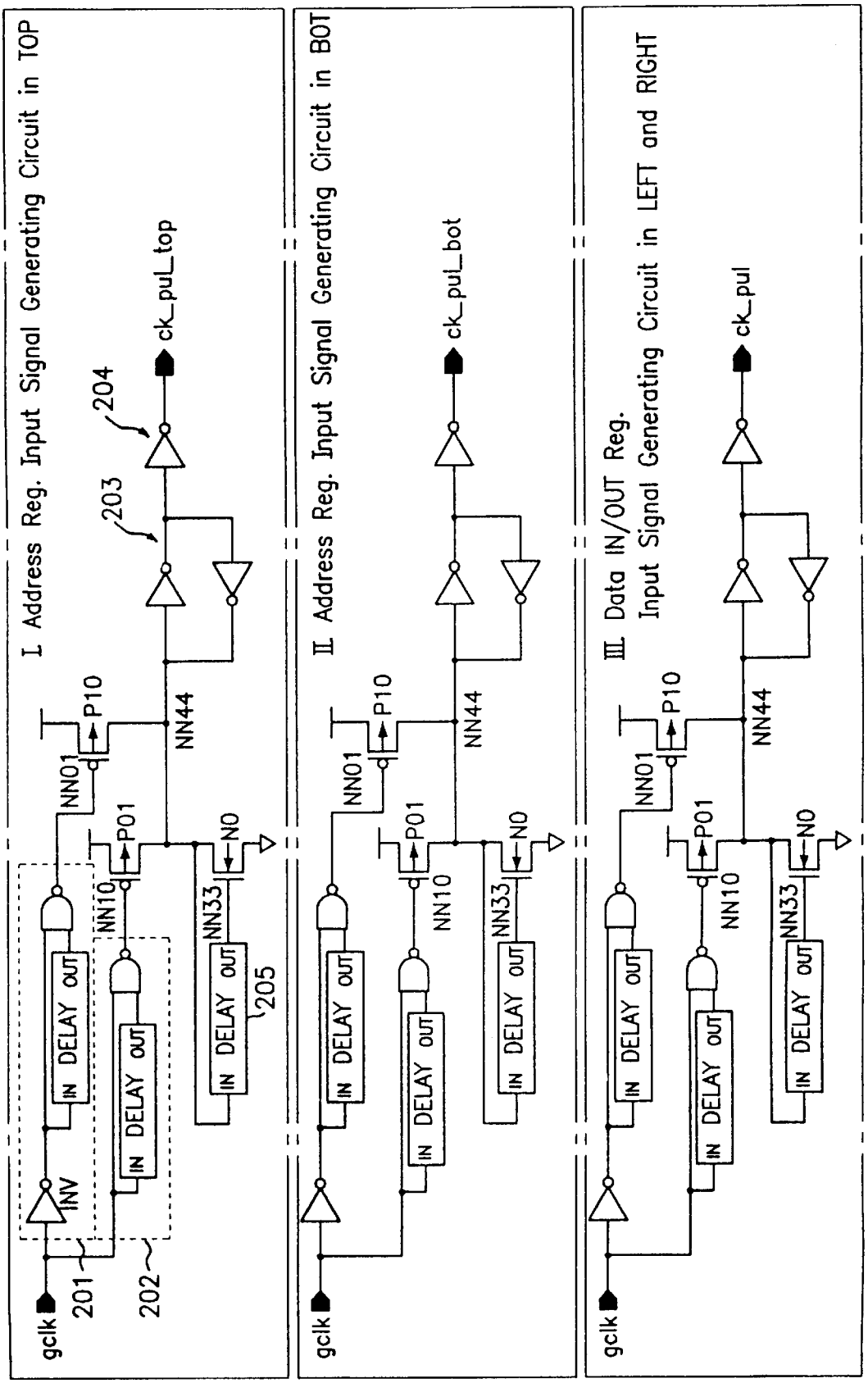
FIG. 2 is a circuit diagram illustrating a frequency multiply section according to an embodiment of the present invention.
Figure 3B:
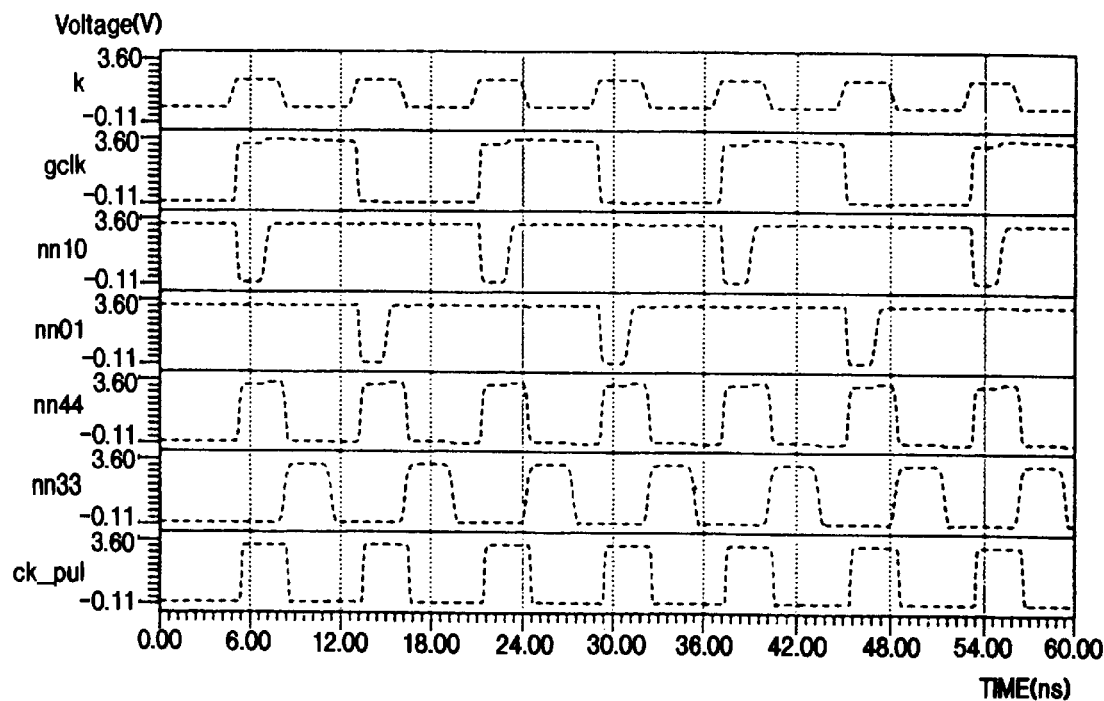
FIG. 3B is a timing diagram of the signals appearing at respective nodes of FIG. 2.

Subsequently, FIG. 2 shows a circuit diagram of the frequency multiplying section of the strobe clock signal. In FIG. 2, it shows that each signal distributed to top, bottom, left, and right of the chip is finally multiplied and then outputted. At this case, the frequency multiplying section shows three which are all same and any one will be explained in the present invention. The FIG. 3B shows a timing waveform at each node of the FIG. 2.

Referring to FIG. 2, the frequency multiplying section includes a first detection section 201, comprising an inverter, a first delay and a first NAND gate, for detecting a falling edge of the divided clock signal gclk, a second detection section 202, comprising a second delay and a second NAND gate, for detecting a rising edge of the divided clock signal gclk, first and second pull-up devices P and P for pulling up their own output terminals in response to outputs of the first and second detection sections 201 and 202, respectively, a pull-down device N0 for pulling down the output terminal in response to an output of a third delay 205 for delaying output signal of the output terminal, a latch section 203 for latching the output terminal; and a buffer device 204 for buffering an output of the latch section 203.

The operation of the strobe clock signal producing apparatus according to the present invention as constructed above will be explained with reference to FIGS. 1a and 1b.

First, if the clock signal K is inputted through a NOR gate 11 and a delay circuit 12 as a delay device, a clock signal gclk, which becomes low at the rising edge of the clock signal K, is produced from the clock transition detection section 10. Then, the clock signal gclk passes through the path gates $G_{11}$ and $G_{12}$, respectively. At this stage, only the pulse of the clock signal K pass through a node NN11 which is connected to a drain of a P-type metal oxide semiconductor (POS) transistor P is connected to an output terminal of the path gate $G_{11}$ to form a waveform gclk-pg, while only the even pulses of the clock signal K pass through a node NN22 which is connected to a drain of a POS transistor P which is connected to an output terminal of the path gate G to form a waveform gclk-ng. Subsequently, the waveforms gclk-pg and gclk-ng are transferred to the buffer section. The size of inverters I11 and I22 of the buffer section should be large enough to maintain the linearity of the waveforms.

Specifically, in the frequency dividing section, the output clock gclk whose period is twice the clock signal K is synchronized with the CPU clock signal K exactly at the rising edge of the CPU clock signal K, and fed back to the section so that the device for driving the buffer and its front end portion is operated at the even and odd rising edges of the clock signal K, respectively. Accordingly, the turn-on time and the number of switching are reduced, thereby reducing the current consumption of the large-sized device and enabling a high speed performance.

In the next stage, in the buffer section (shown in FIG. 1B), the output clock signal gclk becomes high since the PMOS transistor P33 is turned on and pulled up when the clock signal gclk-pg becomes low at the odd rising edge of the clock signal K. Further, the output clock signal gclk becomes low since the NMOS transistor N33 is turned on and pulled down when the clock signal gclk-ng becomes high at the even rising edge of the clock signal K.

Accordingly, although the PMOS transistor P33 and the NMOS transistor N33 are floated when the clock signals gclk-pg and gclk-ng are become high and low, respectively, the level of the clock signal gclk is maintained as it is because the loading capacitance of the output clock signal gclk is more than 10 PF and the output clock signal gclk is latched by the latching device I33.

Specifically, the waveforms gclk-pg and gclk-ng may be obtained by alternatively turning on the path gates g11 and g22 by delaying the output signal gclk as much as the pulse width thereof since the output signal kpul of the clock transition detection section 10 becomes low at the rising and falling edges.

Continuously, in the frequency multiplying section (shown in FIG. 2), nodes NN01 and NN10 are at a low level at the falling and rising edges of the divided clock signal gclk, respectively, and then the PMOS transistors P10 and P01 are turned on. At this time, a node NN44 connected to the drains of the PMOS transistors P10 and P01 and the output signal ck-pul of the frequency multiplying section become high level. The high level signal at node NN44 is delayed through a delay 205 and the delayed signal is inputted into the gate of transistor No and then the NMOS transistor N0 is turned on. As a result, a pull-down operation is happened at NN44, and the output signal ck-pul is transited from a high to a low level.

Accordingly, the pulse width of the positive level of the clock signal ck-pul is determined by the delay device 205, and thus the pulse width of the output signal ck-pul is extended in proportion to the delay time of the delay device I22. Thus, the frequency multiplying section produces the clock signal whose frequency equal to that of the clock signal K by the distributed clock signal gclk and whose pulse width is relative narrow based on the rising edge of the clock signal K.

Figure 4:
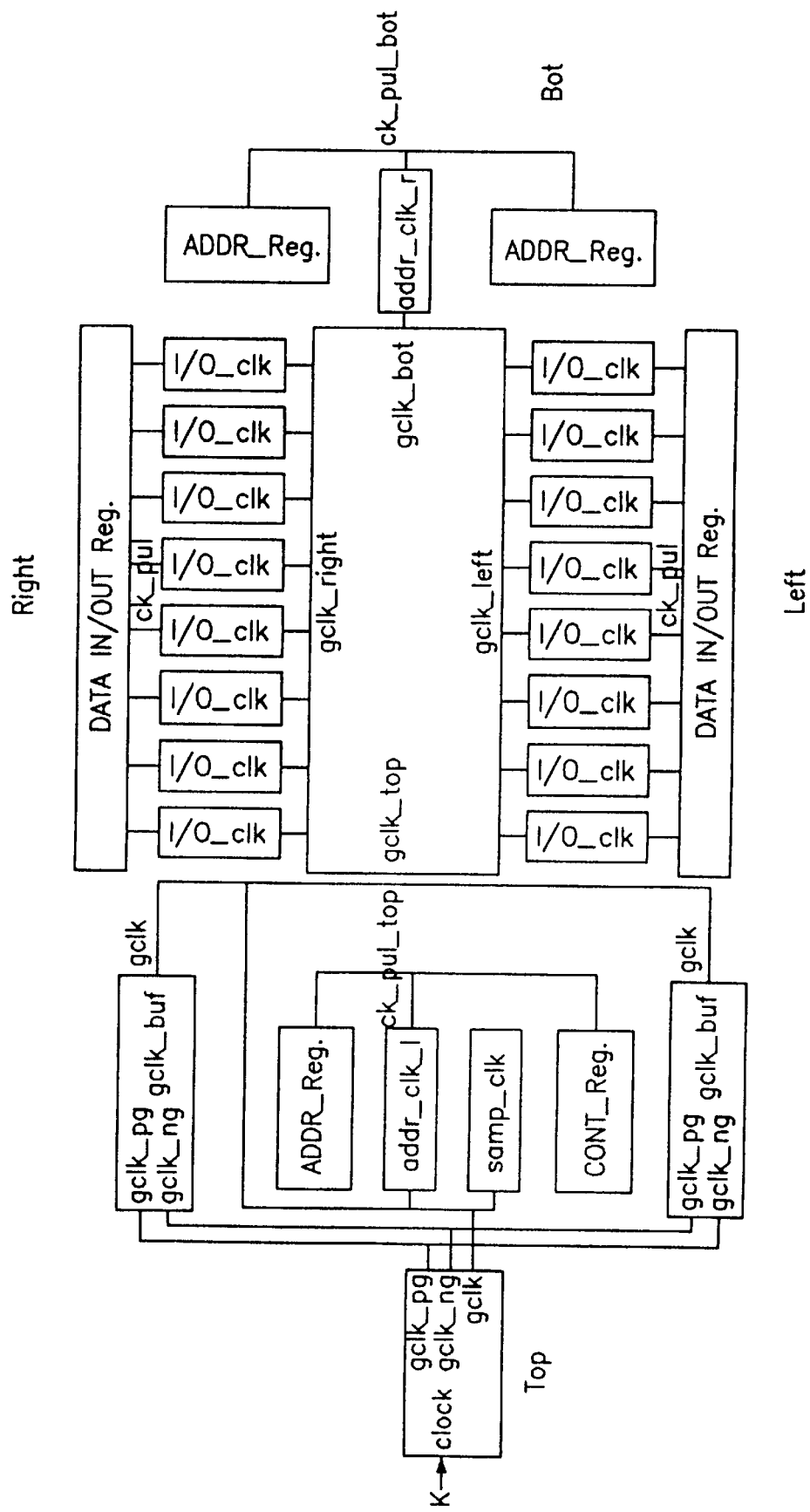
FIG. 4 is a block diagram of a synchronous SRAM chip implementing the conception of the present invention.
Figure 5A:
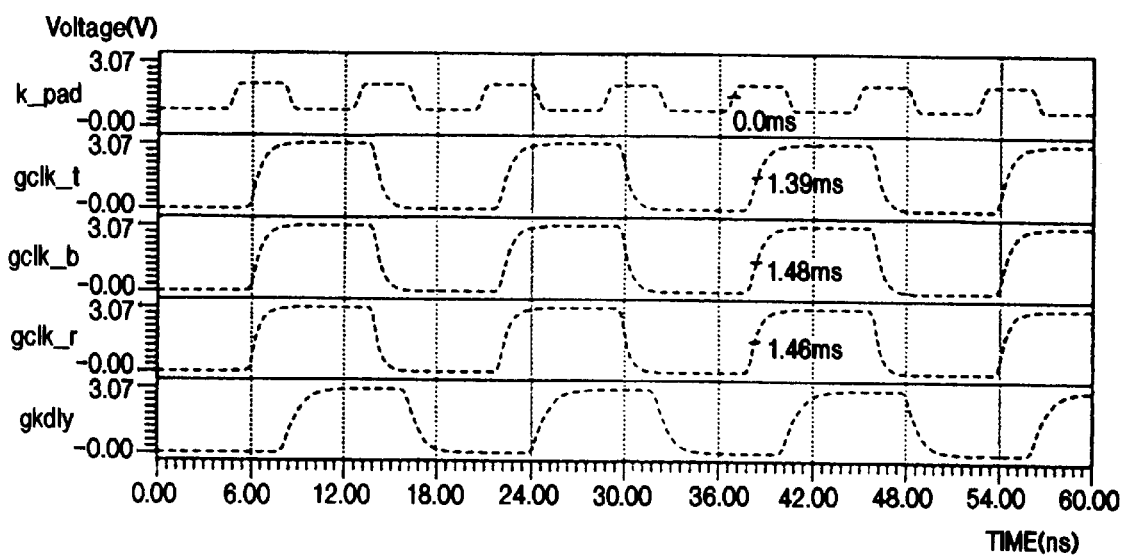
FIGS. 5A and 5B are waveform diagrams of clock signals appearing on top, bottom, left, and right portions of the chip.
Figure 5B:
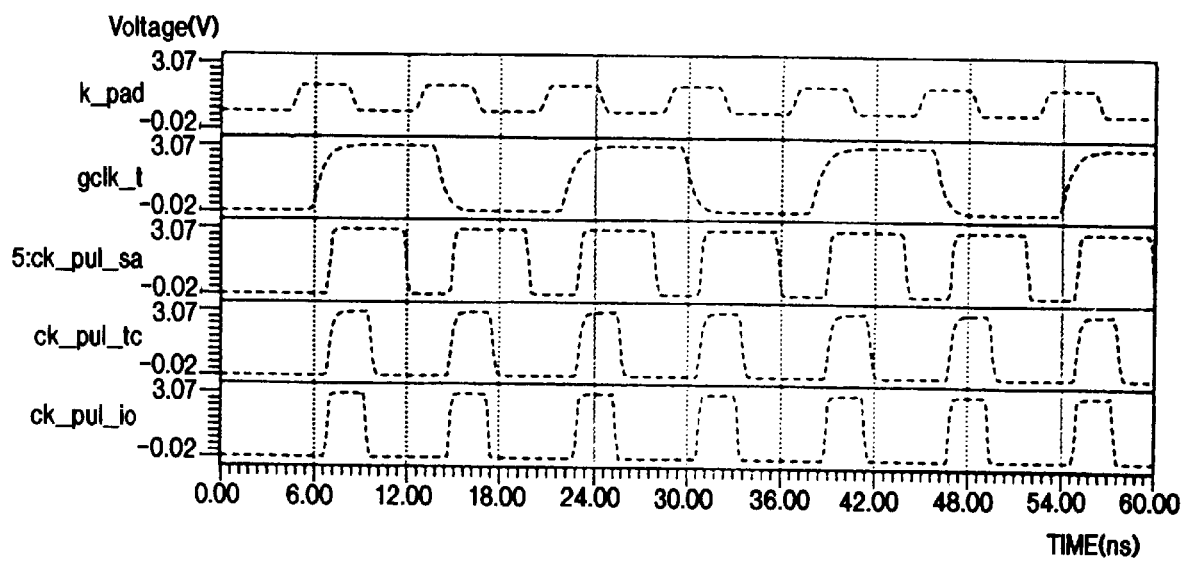

FIG. 4 illustrates a block diagram of the synchronous SRAM chip applying the strobe clock signal producing apparatus as described above. FIGS. 5A and 5B illustrate the waveform diagrams of the output clock signal gclk at top, bottom, left, and right portions.

Referring FIG. 4, in the present invention, the clock signal K inputted from the chip pad is divided by the frequency dividing section and the buffer section as shown in FIGS. 1A and 1B, and the divided clock signal is distributed from the top portion of the chip to left, right, and bottom portions of the chip. Then the divided and distributed clock signal is multiplied by the frequency multiplying section as shown in FIG. 2 so as to use the multiplied clock signal gclk as an input strobe signal for address register, data input/output registers, control registers. By using this frequency multiplying section, the clock signal gclk, which is obtained by dividing the frequency of the clock signal K outputted from a clock generator by ½, is distributed to the top, bottom, left, and right portions of the chip, which form a closed loop, and thus the uniformity of the output signal gclk can be improved. Further, when the clock signal gclk is divided to produce the strobe clock signal for the respective registers, the pulse width of the strobe input signal is properly adjusted, resulting in that the adjustment of set up, holding time of the strobe clock signal with respect to the input clock signal can be easily achieved.

Referring FIGS. 5A and 5B, the clock variation between the output signals gclk-top and gclk-bot does not exceed 0.1 ns.

Figure 6:
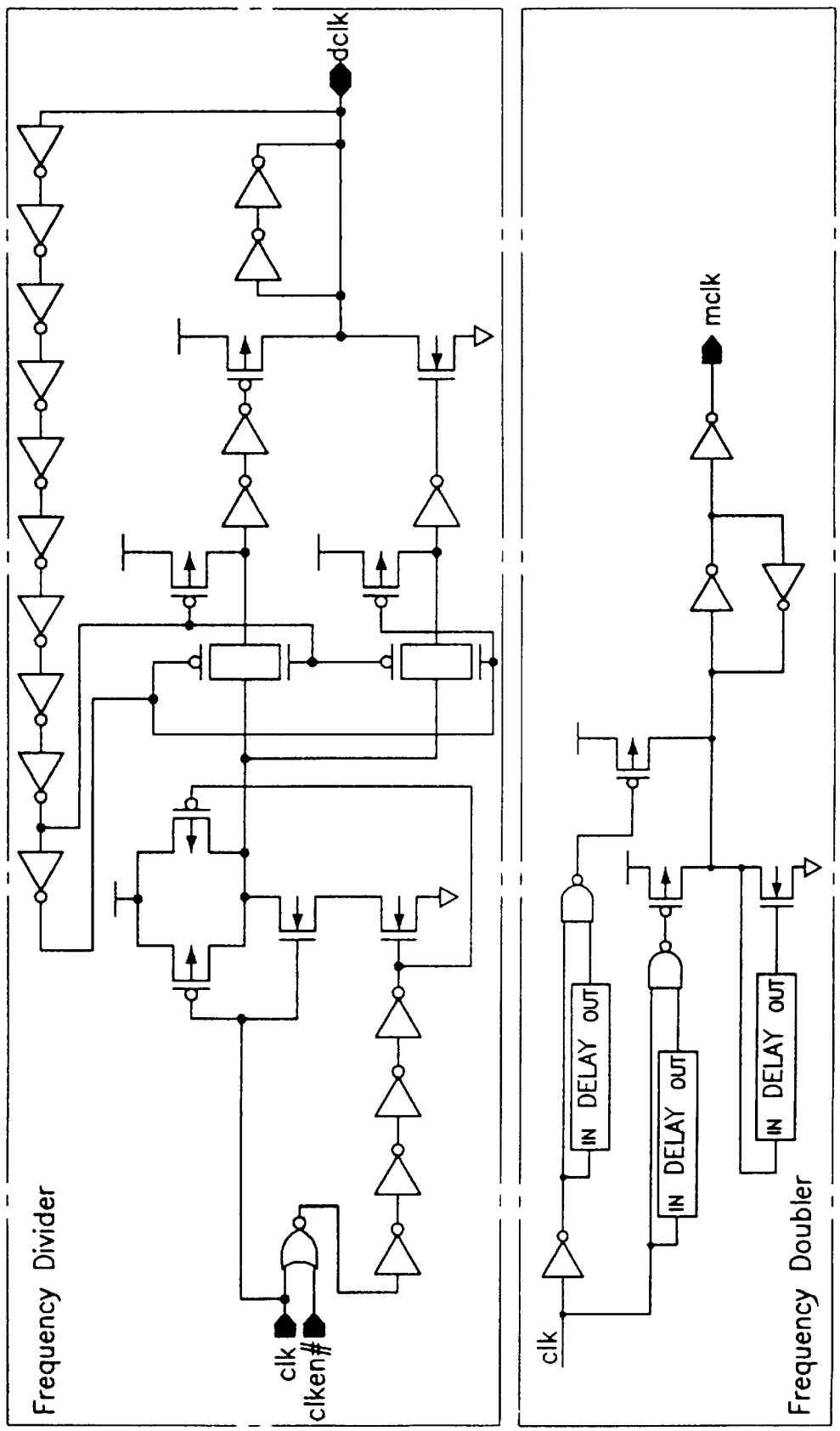
FIG. 6 is a block diagram illustrating another embodiment of the present invention.

In addition to the above-described embodiment, FIG. 6 illustrates a block diagram of another embodiment of the present invention. In this embodiment, typical frequency divider and frequency multiplier can also be used.

As described above, according to the conventional clock distribution, only pulse delay or pulse width is only modulated without frequency variation. However, in the present invention, the strobe clock signal is provided by dividing by ½ the frequency of the input clock signal and then twice increasing the frequency to be provided to the respective registers. Accordingly, since the skew of the clock signal is varied, the pulse width is more narrowed in the high speed operation, thereby solving the problem of the reduced margin.

What is claimed is:

1. A synchronous semiconductor device comprising:
    a first means for dividing a frequency of an input clock signal;
    a second means for bufferring and distributing a divided clock signal outputted from said frequency dividing means to necessary parts of a chip; and
    frequency multiply means, receiving said divided clock signal outputted from said second means, for adjusting a pulse width thereof with a frequency identical to that of said input clock signal, wherein said frequency of said clock signal is divided by said first means, said divided clock signal is distributed from a top portion of said chip to left, right, and bottom portions of said chip, then said divided and distributed clock signal is multiplied by said frequency multiply means to use said multiplied clock signal as a strobe input signal for registers provided in said device.

2. The device as claimed in claim 1, wherein said first means comprises:
    clock transition detection means for detecting a transition of said clock signal inputted from a chip pad to output a clock transition detection pulse signal;
    selective output means for selecting and outputting respective even and odd pulses of said clock transition detection pulse signal outputted from said clock transition detection means; and
    control means for controlling said selective output means.

3. The device as claimed in claim 2, wherein said first means is enabled by an enable signal inputted from said chip pad.

4. The device as claimed in claim 2, wherein said clock transition detection means produces a low level pulse at a rising edge of said clock signal.

5. The device as claimed in claim 4, wherein said clock transition detection means comprises:
    an NOR gate for NOR-gating said enable signal outputted from said pad and said clock signal;
    a delay for delaying an output of said NOR gate; and
    a NAND gate for NAND-gating an output signal of said NOR gate and an output signal of said delay.

6. The device as claimed in claim 2, wherein said selective output means comprises:
    a first path means for passing therethrough only said odd pulses of said clock transition detection pulse signal outputted from said selective output means; and
    a second path means for passing therethrough only said even pulses of said clock transition detection pulse signal outputted from said selective output means.

7. The device as claimed in claim 6, wherein each of said first and second path means comprises a path gate, a pull-up device and a buffer device which are connected to an output terminal of said path gate.

8. The device as claimed in claim 7, wherein said control means controls said path gate and said pull up device by positive and negative outputs which are produced by delaying said divided clock signal.

9. The device as claimed in claim 2, wherein said second means comprises:
    a pull-up device for pulling up its output terminal in response to a clock signal produced by detecting an odd rising edge of said clock signal from said frequency dividing means;
    a pull-down device for pulling down said output terminal in response to a clock signal produced by detecting an even rising edge of said clock signal from said frequency dividing means; and
    a latch device for latching said output terminal.

10. The device as claimed in claim 1, wherein said frequency multiply means comprises:
    a first detection section, comprising an inverter, a first delay and a first NAND gate, for detecting a falling edge of said divided clock signal;
    a second detection section, comprising a second delay and a second NAND gate, for detecting a rising edge of said divided clock signal;
    first and second pull-up devices for pulling up their own output terminals in response to outputs of said first and second detection sections, respectively;
    a pull-down device for pulling down said output terminal in response to an output of a third delay for delaying output signal of said output terminal;
    a latch section for latching said output terminal; and
    a buffer device for buffering an output of said latch means.

* * * * *

UNITED STATES PATENT AND TRADEMARK OFFICE
CERTIFICATE OF CORRECTION

PATENT NO. : 5,771,201
DATED : June 23, 1998
INVENTOR(S) : Cho

It is certified that error appears in the above-identified patent and that said Letters Patent is hereby corrected as shown below:

In the title page, item [30] Foreign Application Priority Data, please delete " Jun. 29, 1997 " and insert -- Jun. 29, 1996 --.

Signed and Sealed this

Twenty-second Day of December, 1998

Attest:

BRUCE LEHMAN

*Attesting Officer*   *Commissioner of Patents and Trademarks*